(12) United States Patent
Kim et al.

(10) Patent No.: US 9,637,816 B2
(45) Date of Patent: May 2, 2017

(54) MASK ASSEMBLY, APPARATUS FOR MANUFACTURING DISPLAY APPARATUS, AND METHOD OF MANUFACTURING DISPLAY APPARATUS

(71) Applicant: Samsung Display Co., Ltd., Yongin, Gyeonggi-Do (KR)

(72) Inventors: Jaesik Kim, Yongin (KR); Wooyong Sung, Yongin (KR); Duckjung Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/849,916

(22) Filed: Sep. 10, 2015

(65) Prior Publication Data
US 2016/0111681 A1  Apr. 21, 2016

(30) Foreign Application Priority Data
Oct. 17, 2014  (KR) ........................ 10-2014-0141193

(51) Int. Cl.
*H01L 21/31* (2006.01)
*C23C 14/04* (2006.01)
*H01L 51/00* (2006.01)
*H01L 51/56* (2006.01)

(52) U.S. Cl.
CPC ........ *C23C 14/042* (2013.01); *H01L 51/0011* (2013.01); *H01L 51/56* (2013.01)

(58) Field of Classification Search
CPC .... C23C 14/042; H01L 51/0011; H01L 51/56
USPC ......................... 438/758, 764, 780, 942, 946
See application file for complete search history.

(56) References Cited

U.S. PATENT DOCUMENTS

| 7,635,652 | B2 | 12/2009 | Chang |
| 8,409,770 | B2 | 4/2013 | Jeong |
| 2009/0258303 | A1* | 10/2009 | Ryu ......................... G03F 1/68 430/5 |
| 2011/0293819 | A1* | 12/2011 | Lee ...................... B08B 7/0035 427/66 |

FOREIGN PATENT DOCUMENTS

| JP | 2002-192850 A | 7/2002 |
| JP | 2011-214078 A | 10/2011 |
| KR | 10-2008-0000432 A | 1/2008 |
| KR | 10-2008-0052730 A | 6/2008 |

* cited by examiner

*Primary Examiner* — Kevin M Picardat
(74) *Attorney, Agent, or Firm* — Robert E. Bushnell, Esq.

(57) ABSTRACT

Provided are a mask assembly, an apparatus for manufacturing a display apparatus, and a method of manufacturing the display apparatus. The mask assembly includes a mask comprising an opening having a pattern; and a self-assembled monolayer (SAM) that is coated on at least a portion of the mask.

17 Claims, 3 Drawing Sheets

MASK ASSEMBLY, APPARATUS FOR MANUFACTURING DISPLAY APPARATUS, AND METHOD OF MANUFACTURING DISPLAY APPARATUS

CLAIM OF PRIORITY

This application claims the benefit of Korean Patent Application No. 10-2014-0141193, filed on Oct. 17, 2014, in the Korean Intellectual Property Office, the disclosure of which is incorporated herein in its entirety by reference.

BACKGROUND OF THE INVENTION

Field of the Invention

One or more exemplary embodiments relate to a mask assembly, an apparatus for manufacturing a display apparatus, and a method of manufacturing a display apparatus.

Description of the Related Art

Use of portable electronic devices has remarkably increased. Examples of portable electronic devices may include small electronic devices, such as mobile phones and tablet PCs.

Such portable electronic devices may include display apparatuses to provide visual information, e.g., images, to users and to support various functions. Due to the reduction in the sizes of components for driving display apparatuses, the display apparatuses have become more important in electronic devices. Also, display apparatuses that may be bent, e.g., at a predetermined angle, from a flat state have been considered.

SUMMARY OF THE INVENTION

One or more exemplary embodiments include a mask assembly, an apparatus for manufacturing a display apparatus by using the mask assembly, and a method of manufacturing the display apparatus by using the mask assembly.

Additional aspects will be set forth in part in the description which follows and, in part, will be apparent from the description, or may be learned by practice of the presented exemplary embodiments.

According to one aspect of the present invention, there is provided a mask assembly that includes a mask comprising an opening having a pattern and a self-assembled monolayer (SAM) coated on at least a portion of the mask. The SAM may include a head that contacts the mask, a linker connected to the head and a terminal connected to the linker. The head may be hydrophilic and the terminal may be hydrophobic. The SAM may include at least one of trichlorooctadecylsilane (OTS), fluoroctatrichlorosilane (FOTS), and dichlorodimethylsilane (DDMS). The SAM may be coated about the opening. The SAM may be coated on a surface of the mask that faces a deposition source.

According to another aspect of the present invention, there is provided an apparatus for manufacturing a display apparatus, the apparatus including a chamber, a deposition source arranged within the chamber to accommodate and emit a deposition material, a mask separated from the deposition source and including an opening to form a pattern on a substrate, wherein a self-assembled monolayer (SAM) is coated on at least a portion of the mask. The SAM may include a head that contacts the mask, a linker connected to the head and a terminal connected to the linker. The head may be hydrophilic and the terminal may be hydrophobic. The SAM may include at least one of trichlorooctadecylsilane (OTS), fluoroctatrichlorosilane (FOTS), and dichlorodimethylsilane (DDMS). The SAM may be coated about the opening. The SAM may be coated on a surface of the mask that faces a deposition source.

According to yet another aspect of the present invention, there is provided a method of manufacturing a display apparatus, the method including providing a chamber including a deposition source that accommodates a deposition material within, inserting a substrate and a mask into the chamber, the mask being interposed between the deposition source and the substrate and including an opening, aligning the substrate and the mask and depositing the deposition material onto the substrate via the opening in the mask by heating the deposition source, wherein a self-assembled monolayer (SAM) is coated on at least a portion of the mask. The SAM may include a head that contacts the mask, a linker connected to the head and a terminal connected to the linker. The head may be hydrophilic and the terminal may be hydrophobic. The SAM may include at least one of trichlorooctadecylsilane (OTS), fluoroctatrichlorosilane (FOTS), and dichlorodimethylsilane (DDMS). The SAM may be coated about the opening. The SAM may be coated on a surface of the mask that faces a deposition source.

These general and specific embodiments may be implemented by using a system, a method, a computer program, or a combination of the system, the method, and the computer program.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
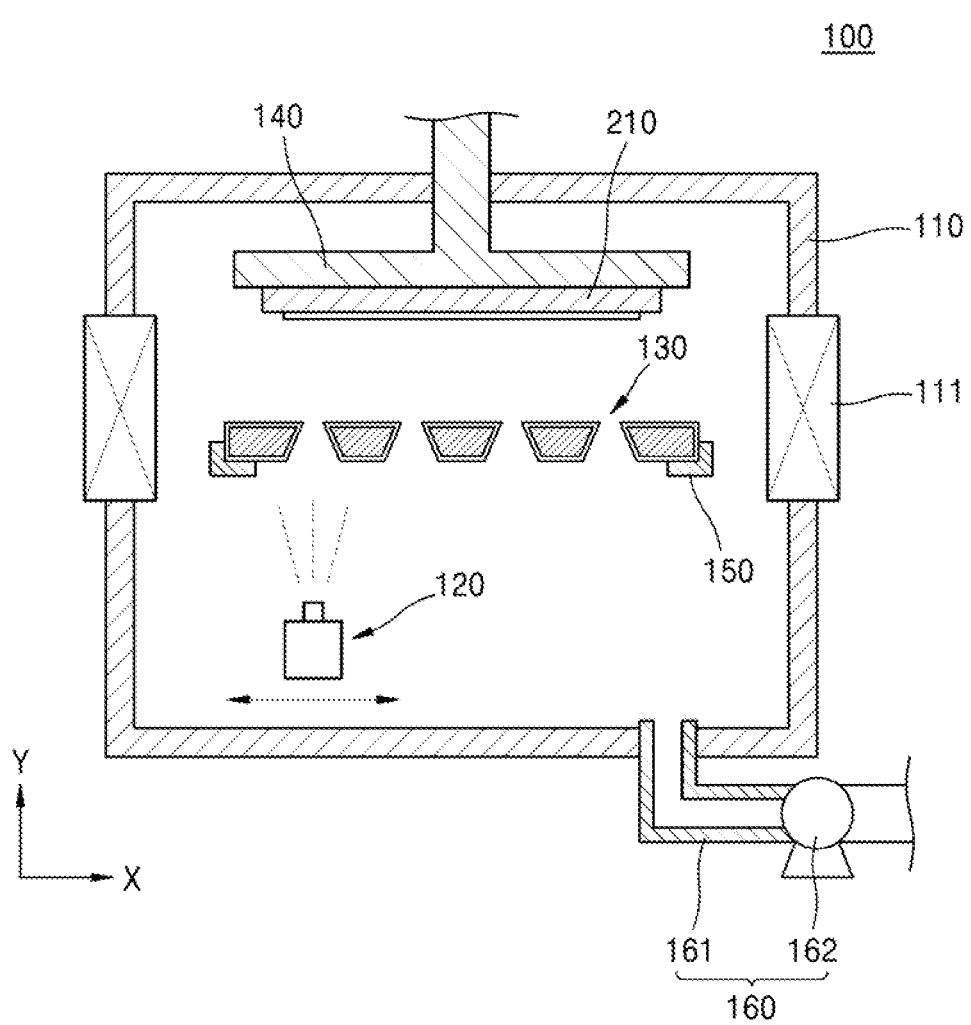
FIG. 1 is a conceptual view of an apparatus for manufacturing a display apparatus, according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the inventive concept allows for various changes and numerous embodiments, particular embodiments will be illustrated in the drawings and described in detail in the written description. The effect and features of the inventive concept and the method of realizing the effect and the features will be clear with reference to the exemplary embodiments described in detail below with reference to the drawings. However, the inventive concept may be embodied in various forms and should not be construed as being limited to the exemplary embodiments.

Hereinafter, the exemplary embodiments of the present inventive concept will be described in detail with reference to the accompanying drawings. Like reference numerals in the drawings denote like elements, and thus their description will not be repeated.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2A:
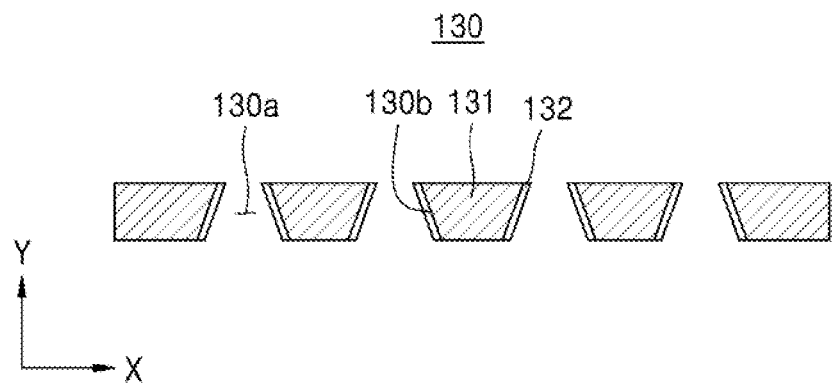
FIGS. 2A, 2B and 2C are conceptual views of mask assemblies for the apparatus of FIG. 1.
Figure 2B:
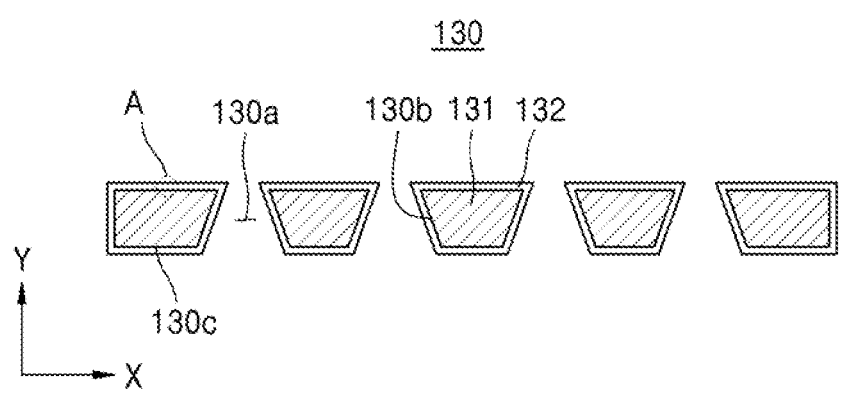
Figure 2C:
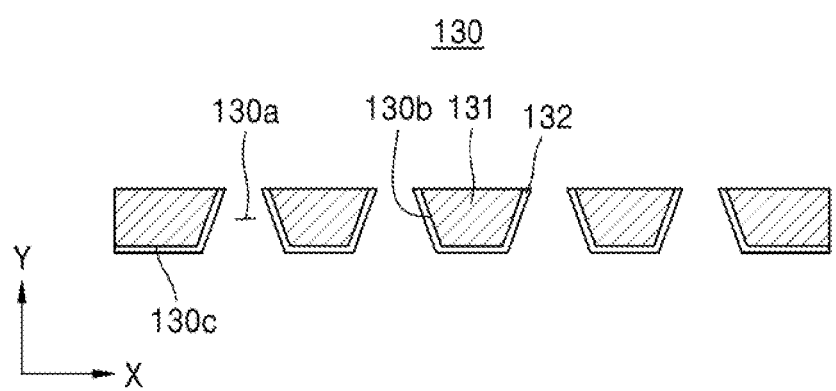
Figure 3:
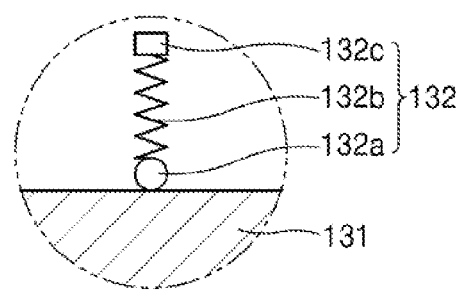
FIG. 3 is an enlarged view of a portion A of FIG. 2.

Turning now to FIGS. 1 to 2C, FIG. 1 is a conceptual view of an apparatus 100 for manufacturing a display apparatus according to an exemplary embodiment, FIGS. 2A, 2B and 2C are conceptual views of mask assemblies 130 of FIG. 1, and FIG. 3 is an enlarged view of a portion A of the mask assemblies illustrated by FIGS. 2A, 2B and 2C.

Referring to FIGS. 1 to 3, the apparatus 100 for manufacturing the display apparatus may include a chamber 110, a deposition source 120, the mask assembly 130, a substrate fixing unit 140, a mask supporting unit 150, and a suction unit 160.

The mask assembly 130 and a substrate 210 may be inserted into and disposed within an inner area of the chamber 110. Therefore, the inner area of the chamber 110 may be completely blocked from the outside, except for a portion connected to the outside via a gate valve 111.

The deposition source 120 may evaporate a deposition material and expel the evaporated deposition material to the outside. A variety of deposition materials may be used. For example, the deposition material may include a metal for forming a cathode electrode, or an organic material for forming an organic emission layer. Alternatively, the deposition material may include an organic material for forming an organic layer of a thin film encapsulating layer. However, the deposition material is not limited to the above, and may include any material that may be deposited by evaporation and is used in the field of display apparatuses. However, hereinafter, an example in which the deposition material includes an organic material for forming an organic emission layer will be described in detail for convenience of description.

The deposition source 120 may be identical or similar to that generally used to manufacture the display apparatus. For example, the deposition source 120 may include a crucible in which the deposition material is disposed, a heater surrounding an external surface of the crucible to heat the crucible, and a nozzle provided on the crucible to emit the evaporated deposition material to the outside.

The mask assembly 130 may include an opening 130a to form a pattern on the substrate 210. The opening 130a may be a slot or a hole, and mask assembly 130 may include a plurality of openings spaced apart at predetermined intervals.

The mask assembly 130 may include a mask 131 in which the opening 130a is formed. The mask 131 may be formed of a metal. The mask assembly 130 may include a self-assembled monolayer (SAM) 132 that is coated on at least a portion of the mask 131. The SAM 132 may be coated at various locations of the mask 131. For example, the SAM 132 may be formed in an area where the opening 130a is formed. According to an embodiment, the SAM 132 may be only coated on an inner surface 130b of the opening 130a. Alternatively, according to another embodiment, the SAM 132 may be coated on the inner surface 130b of the opening 130a and a surface 130c of the mask 131 which faces the deposition source 120. According to another embodiment, the SAM 132 may be coated on an entire surface of the mask 131 including the inner surface 130b of the opening 130a. Hereinafter, an example in which the SAM 132 is coated on the entire surface of the mask 131 will be described in detail for convenience of description.

The SAM 132 may include a head 132a that contacts the mask 131, a linker 132b connected to the head 132a, and a terminal 132c connected to the linker 132b. The linker 132b may be formed of a plurality of alkyl chains. Also, the head 132a may be hydrophilic. In particular, the head 132a may include silane to have a strong covalent bond. The terminal 132c may include a functional organic material and may be hydrophobic.

The SAM 132 may include at least one selected from n-octadecyltrichlorooctadecylsilane (OTS), fluoroctatrichlorosilane (FOTS), and dichlorodimethylsilane (DDMS). OTS has $SiCl_3$ can constitute the head 132a, while $C_{18}H_{37}$ may constitute the linker 132b and $CH_3$ may constitute the terminal 132c. When tested using an existing inkjet nozzle, the SAM layers of the present invention exhibited excellent robustness to a thickness as little as 1 nm, however the present invention is in no way so limited by this thickness. Unlike the scenario where a photoresist is coated onto the mask, the SAM layers of the present invention are suitable for forming ultra high-definition patterns on a substrate, and do not produce a shadow due to an irregular coating.

Various methods may be used to coat the SAM 132 onto the mask 131. For example, liquid phase deposition or vapor phase deposition may be used to coat a material for forming the SAM 132. The SAM 132 may be coated on the mask 131 by using vapor phase deposition. Specifically, the mask 131 may be inserted into the chamber 110, and the material for forming the SAM 132 may be evaporated and adsorbed onto the mask 131, thereby coating a surface of the mask 131. In particular, the head 132a may be adsorbed on the mask 131 so that the SAM 132 is coated on the mask 131 by adsorption, and the terminal 132c may protrude to the outside. Also, when vapor phase deposition is used, the SAM 132 may be uniformly coated on the surface of the mask 131 without being affected by nano structures formed on the surface of the mask 131 or roughness of the surface of the mask.

The substrate fixing unit 140 may be formed to fix the substrate 210. The substrate fixing unit 140 may fix the substrate 210 such that a surface of the substrate 210 where the deposition material is to be deposited may face the deposition source 120.

The substrate fixing unit 140 may have various shapes. For example, the substrate fixing unit 140 may be an electrostatic chuck to which the substrate 210 is attached. According to another exemplary embodiment, the substrate fixing unit 140 may be a clamp or a bracket into which the substrate 210 is accommodated. The substrate fixing unit 140 is not limited to the above, and may include any apparatus for fixing the substrate 210. However hereinafter, an example in which the substrate fixing unit 140 is an electrostatic chuck will be described in detail for convenience of description.

The substrate fixing unit 140 may move relative to the deposition source 120. According to an embodiment, the substrate fixing unit 140 may linearly move in one direction and the deposition source 120 may be fixed. According to another embodiment, the deposition source 120 may linearly move in one direction with respect to the substrate fixing unit 140, and the substrate fixing unit 140 may be fixed. According to another embodiment, each of the substrate fixing unit 140 and the deposition source 120 may linearly move in one direction. However, hereinafter, an example in which the substrate fixing unit 140 is fixed within the chamber 110 and the deposition source 120 is linearly movable will be described in detail for convenience of description.

The mask supporting unit 150 may fix the mask assembly 130. In this case, the mask supporting unit 150 may fix the mask assembly 130 via a tensile force applied to stretch the mask assembly 130. For example, the mask supporting unit 150 may fix the mask assembly 130 by clamping a side of the mask assembly 130 and stretching the mask assembly 130 in a lengthwise direction or widthwise direction of the mask assembly 130.

The suction unit 160 may be connected to the chamber 110, and may adjust a pressure inside the chamber 110. The suction unit 160 may include a flow pipe 161 connected to the chamber 110 and a pump 162 provided on the flow pipe 161.

A method of manufacturing a display apparatus (200)(see FIG. 4) by using the apparatus 100 described above will be described below. First, the substrate 210 and the mask assembly 130 may be inserted into the chamber 110, and then various layers may be formed on the substrate 210. In this case, a thin film transistor (TFT) (see FIG. 4), a pixel defining layer 290 (see FIG. 4), etc. may be formed on the substrate 210.

When the substrate 210 and the mask assembly 130 are inserted into the chamber 110, the substrate 210 may be fixed on the substrate fixing unit 140, and the mask assembly 130 may be fixed to the mask supporting unit 150. Then, respective positions of the substrate 210 and the mask assembly 130 may be aligned, and a deposition material may be sprayed from the deposition source 120. The deposition source 120 may linearly move in a lengthwise direction or a width direction of the substrate 210.

The deposition material evaporated from the deposition source 120 may be deposited onto the substrate 210 in a certain pattern via the mask assembly 130. The deposition material for the organic light emitting layer 282 (see FIG. 4) may be deposited on an open portion of the pixel defining layer 290 (see FIG. 4).

As the processes above are being performed, the mask assembly 130 may contact or be spaced-apart from the substrate 210. In either case, if the deposition material passes through an opening 130a in the mask assembly 130, the deposition material may be adsorbed onto the mask assembly 130.

In the related art, if a deposition process is performed without separately coating a surface of a mask, a deposition material may be adsorbed onto the surface of the mask. The deposition material may be deposited around the surface or an opening of the mask, or be deposited at a side wall of the opening, so that a size of the opening or a thickness of the mask around the opening is changed. In this case, as the deposition material flows, a flowing path may become blocked by the deposition material deposited on the mask assembly 130, and thus, a shadow defect may be formed on the substrate 210. That is, when a deposition material changes a size of an open area of the opening 130a of the mask assembly 130 as described above, due to the deposition material deposited on the mask assembly 130, a pattern may not be accurately formed with a deposition material to be deposited on the substrate 210. In particular, when depositing a deposition material, since the deposition material is applied to a sidewall of the opening 130a of the mask assembly 130, a pattern on the substrate 210 through a previously designed opening may be distorted or only partially formed, or the deposition material may be deposited on unexpected portion of the substrate 210. Also, when a deposition process is performed many times by using the same mask as above, a different deposition pattern may be formed during each deposition process, and thus, a product with a uniform pattern may be difficult to manufacture.

Alternatively, in the case that a deposition material is deposited on the substrate 210 or the deposition process is repeated many times, when the mask assembly 130 is used, a deposition material deposited on a surface of the mask assembly 130 facing the deposition source 120 may be stacked to a predetermined thickness. The deposition material stacked on the surface of the mask assembly 130 may partially block or change a path via which the deposition material is transferred to the opening 130a. In this case, the deposition material may not be able to move along a previously designed path, and thus, it may be difficult to deposit and accurately pattern the deposition material on the substrate 210.

In order to prevent this problem in the related art, the mask assembly 130 was cleaned after being used for a predetermined number of times or a predetermined period, so as to remove the deposition material adsorbed onto the mask.

However, according to exemplary embodiments of the present inventive concept, the mask assembly 130, the apparatus 100, and the method of manufacturing the display apparatus may include the SAM 132 that may prevent the deposition material from being adsorbed onto mask assembly 130. Specifically, since the terminal 132c is hydrophobic, the terminal 132c may not react with the deposition material or may not be combined with the deposition material. Thus, the terminal 132c may prevent the deposition material from being deposited onto the SAM 132.

Also, when the deposition processes are being performed by using the mask assembly 130, the deposition material may be deposited on the mask by an amount less than a deposition material deposited on a mask in the related art. In this case, the SAM 132 may not be detached from the mask 131, even when the mask assembly 130 is cleaned by using a cleaning method of the related art, and thus the mask assembly 130 may be continuously used.

Specifically, in the related art, when a mask is cleaned by using N-methyl-2-pyrrolidone (NMP) solvent, a polyimide (PI) residue may be generated. However, if trichlorooctadecylsilane (OTS) is deposited on the mask as a SAM layer to increase layer durability, and the OTS-deposited mask is cleaned thereafter, it is possible that for the mask to be used and remain in good condition for over 90 days, while defects may occur within 15 days after cleaning in a mask of the related art that is absent of the OTS SAM layer.

Also, after a surface of the mask of the present invention is cleaned, the OTS layer will have fewer defects and high hydrophobic characteristics (a contact angle based on deionized water (DI)≥105°) as compared to the mask of the related art, so that a diffusion time of NMP penetration is prolonged. Thus, a lifting occurrence on an OTS SAM layer is low.

Therefore, according to the mask assembly 130, the apparatus 100, and the method of manufacturing the display apparatus of the present invention, since the mask assembly 130 may be used for a long time, a display apparatus may be manufactured easily and with less cost. Also, according to the mask assembly 130, the apparatus 100, and the method of manufacturing the display apparatus of the present invention, the mask assembly 130 may be permanently used since the SAM 132 is not removed after the mask assembly 130 is cleaned.

According to the mask assembly 130 of the present invention, the apparatus 100, and the method of manufacturing the display apparatus, the deposition material may be prevented from being adsorbed onto a surface of the mask assembly 130. so that the deposition material may be formed on the substrate 210 in a predetermined pattern, even when a plurality of display apparatuses are repeatedly manufactured.

In particular, since a defect rate when manufacturing the display apparatuses may be reduced by using the mask assembly 130, the apparatus 100, and the method of manufacturing the display apparatus of the present invention, productivity may be improved.

Figure 4:
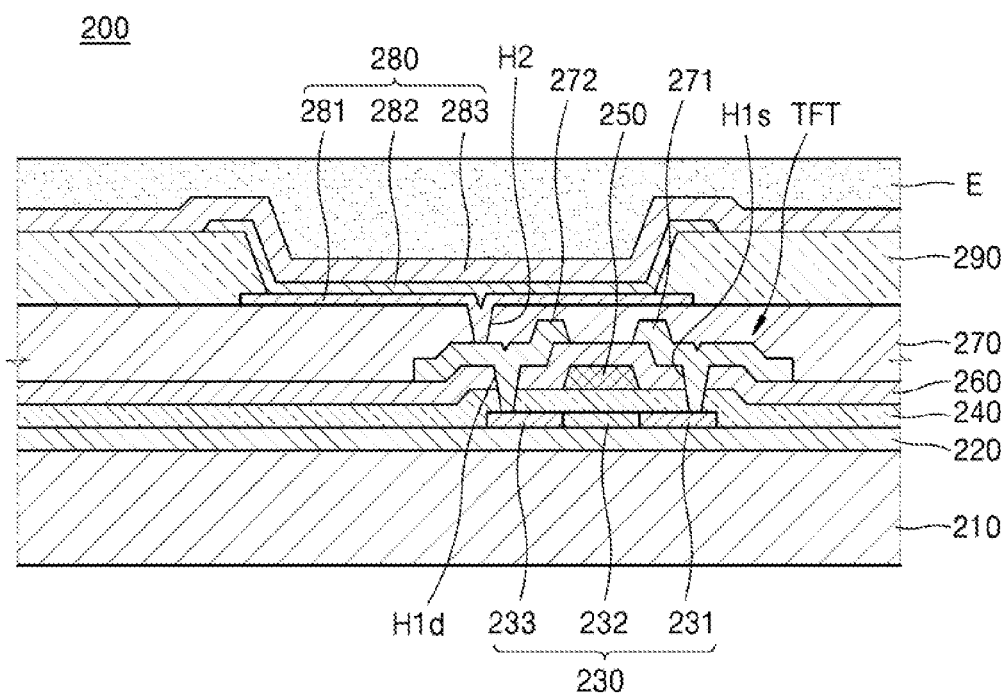
FIG. 4 is a cross-sectional view of a portion of a display apparatus manufactured by using the apparatus of FIG. 1.

Turning now to FIG. 4, FIG. 4 is a cross-sectional view of a portion of a display apparatus 200 manufactured by using the apparatus 100 of FIG. 1. Referring to FIG. 4, the display apparatus 200 may include a substrate 210 and a display unit (not shown). Also, the display apparatus 200 may include a thin film encapsulation layer E or an encapsulation substrate (not shown) formed on the display unit. Since the encapsulation substrate is the same as or similar to that used in a general display apparatus, a description of the encapsulation substrate will be omitted. Hereinafter, an example in which the display apparatus 200 includes the thin film encapsulation layer E will be described in detail for convenience of description.

The display unit may be formed on the substrate 210. For example, the display unit may include a TFT, and a passivation layer 270 may be formed to cover the TFT. An organic light-emitting device (OLED) 280 may be formed on the passivation layer 270.

The substrate 210 may include, for example, glass, plastic, or metal, such as stainless steel (SUS) or titanium (Ti). Alternatively, the substrate 210 may be formed of polyimide (PI). Hereinafter, an example in which the substrate 210 is formed of glass will be described in detail for convenience of description.

A buffer layer 220, formed of an organic compound and/or an inorganic compound, may be additionally formed on the substrate 210. The buffer layer 220 may be formed of, for example, $SiO_x$ (x≥1) or $SiN_x$ (x≥1).

An active layer 230 having a predetermined pattern may be formed on the buffer layer 220, and then, the active layer 230 may be covered by a gate insulating layer 240. The active layer 230 may include a source area 231, a drain area 233, and a channel area 232 between the source and drain areas 231 and 233.

The active layer 230 may include various materials. For example, the active layer 230 may include an inorganic semiconductor material, such as amorphous silicon or crystalline silicon. For example, the active layer 230 may include an oxide semiconductor material. As another example, the active layer 230 may include an organic semiconductor material. Hereinafter, an example in which the active layer 230 is formed of amorphous silicon will be described in detail for convenience of description.

The active layer 230 may be formed by forming an amorphous silicon layer on the buffer layer 220, crystallizing the amorphous silicon layer to form a polycrystalline silicon layer, and patterning the polycrystalline silicon layer. In the active layer 230, the source and drain areas 231 and 233 may be doped with impurities according to a type of TFTs, i.e., according to whether the TFT is a driving TFT or a switching TFT.

A gate electrode 250 that corresponds to the channel area 232 of the active layer 230, and an interlayer insulating layer 260 that covers the gate electrode 250, may be formed on the gate insulating layer 240. Contact holes H1s and H1d may be formed on the interlayer insulating layer 260 and in the gate insulating layer 240, and then a source electrode 271 and a drain electrode 272 may be formed on the interlayer insulating layer 260, such that they respectively contact the source area 231 and the drain area 233 and fill the contact holes H1s and H1d respectively.

The passivation layer 270 is formed on the above-described TFT, and a pixel electrode 281 of the OLED 280 may be formed on the passivation layer 270. The pixel electrode 281 may contact the drain electrode 272 of the TFT via a via hole H2 in the passivation layer 270. The passivation layer 270 may be formed as a single layer or a plurality of layers including at least one inorganic layer and/or at least one organic layer. The passivation layer 270 may be formed as a planarization layer such that an upper surface thereof is flat regardless of curves in a low layer thereof, or alternatively, curved correspondingly to the curves in the lower layer thereof. In an implementation, the passivation layer 270 may be formed of a transparent insulating material to obtain a resonance effect.

After the pixel electrode 281 is formed on the passivation layer 270, a pixel defining layer 290 may be formed by using an organic material and/or an inorganic material to cover the pixel electrode 281 and the passivation layer 270, and an opening in pixel defining layer 290 may be formed to expose a portion of the pixel electrode 281. In addition, an intermediate layer 282, which may include the organic emission layer, and an opposite electrode 283, may be formed on the exposed portion of the pixel electrode 281 within the opening formed in the pixel defining layer 290.

The pixel electrode 281 may function as an anode electrode, and the opposite electrode 283 may function as a cathode electrode, or vice versa. The pixel electrode 281 and the opposite electrode 283 may be insulated from each other by the intermediate layer 282. Voltages of different polarities may be applied to the intermediate layer 282, so that an organic emission layer (organic EML) emits light.

The intermediate layer 282 may include the organic EML. In an implementation, the intermediate layer 282 includes the organic EML, and may further include at least one selected from a hole injection layer (HIL), a hole transport layer (HTL), an electron transport layer (ETL), and an electron injection layer (EIL).

A unit pixel may include a plurality of sub-pixels that may emit various colors of light. For example, the plurality of sub-pixels may include sub-pixels that emit red, green, and blue light, or sub-pixels that emit red, green, blue, and white light.

The thin film encapsulation layer E may include a plurality of inorganic layers, or an inorganic layer and an organic layer. The organic layer of the thin film encapsulation layer E may be formed of a polymer, and may be a single layer or a stack of layers formed of any material selected from polyethylene terephthalate, polyimide, polycarbonate, epoxy, polyethylene, and polyacrylate. The organic layer may be formed of polyacrylate, e.g., may include a polymerized monomer composition including diacrylate-based monomer and triacrylate-based monomer. The monomer composition may further include monoacrylate-based monomer. In an implementation, the monomer composition may further include a suitable photo initiator, e.g., trimethyl benzoyl diphenyl phosphine oxide (TPO).

The inorganic layer of the thin film encapsulation layer E may be a single layer or a stack of layers including a metal oxide or a metal nitride. For example, the inorganic layer may include any one selected from $SiN_x$, $Al_2O_3$, $SiO_2$, and $TiO_2$. The top layer of the thin film encapsulation layer E that is exposed to the outside may be formed of an inorganic layer in order to help prevent intrusion of moisture into the OLED 280.

In one implementation, the thin film encapsulation layer E may include at least one sandwich structure in which at least one organic layer is inserted between at least two inorganic layers. In another implementation, the thin film encapsulation layer E may include at least one sandwich structure in which at least one inorganic layer is inserted between at least two organic layers. In yet another implementation, the thin film encapsulation layer E may include a sandwich structure in which at least one organic layer is inserted between at least two inorganic layers and a sandwich structure in which at least one inorganic layer is inserted between at least two organic layers.

In the one implementation, the thin film encapsulation layer E may include a first inorganic layer, a first organic layer, and a second inorganic layer sequentially formed from the top portion of the OLED 280. In the another implementation, the thin film encapsulation layer E may include a first organic layer, a first inorganic layer, a second organic layer, a second organic layer, and a third inorganic layer sequentially formed from the top portion of the OLED 280. In the yet another implementation, the thin film encapsulation layer E may include a first inorganic layer, a first organic layer, a second inorganic layer, a second organic layer, a third inorganic layer, a third organic layer, and a fourth inorganic layer sequentially formed from the top portion of the OLED 280.

A halogenated metal layer including lithium fluoride (LiF) may be additionally included between the OLED 280 and the first inorganic layer. The halogenated metal layer may help prevent the OLED 280 from being damaged during the formation of the first inorganic layer by a sputtering method or a plasma deposition method. The first organic layer may be smaller than the second inorganic layer, and the second organic layer may be smaller than the third inorganic layer.

Since patterns of layers may be formed in detail in the display apparatus 200 manufactured by using the mask assembly 130, the apparatus 100 and the manufacturing method described above may produce the display apparatus 200 having high resolution. Also, when the mask assembly 130, the apparatus 100, and the manufacturing method described above are used to continuously manufacture a plurality of display apparatuses 200, the display apparatuses 200 may be manufactured to have the same quality.

As described above, according to the one or more of the above exemplary embodiments, a mask assembly, an apparatus for manufacturing a display apparatus, and a method of manufacturing the display apparatus may be characterized by improved production efficiency. In a vacuum deposition apparatus, when a thin film is formed on a substrate using an evaporation/deposition technique, a mask having a plurality of openings to form an ultra high-definition pattern on a substrate is interposed between a deposition source and the substrate. However, earlier masks have the problem in that the deposition material not only forms on portions of the substrate, but also forms on portions of the mask, including portions of the mask corresponding to the openings. This can cause the size of the mask openings to change, thereby resulting in erroneous dimensions of the deposition film on the substrate.

In the embodiments of the present invention, either portions of the mask or an entirety of all the surfaces of the mask are coated with a self-assembled monolayer (SAM) having hydrophobic properties to prevent a deposition material from depositing onto the mask, thereby achieving a uniform pattern on the substrate. Even if deposition material were to form on the mask, the mask can still be cleaned without removing the SAM layer, and the mask can remain in good condition for over 90 days after cleaning. Consequently, productivity, production yield and throughput can be improved, as well as the quality of the thin film deposited on the substrate according, to the embodiments of the present invention.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A mask assembly, comprising:
   a deposition mask comprising an opening, the opening being an aperture; and
   a self-assembled monolayer (SAM) coated on at least a portion of the deposition mask, wherein the SAM comprises:

a head that contacts the mask;
a linker connected to the head; and
a terminal connected to the linker.

2. The mask assembly of claim 1, wherein the head is hydrophilic.

3. The mask assembly of claim 2, wherein the terminal is hydrophobic.

4. The mask assembly of claim 1, wherein the SAM comprises at least one material selected from a group consisting of trichlorooctadecylsilane (OTS), fluoroctatrichlorosilane (FOTS), and dichlorodimethylsilane (DDMS).

5. The mask assembly of claim 1, wherein the SAM is coated about an inner surface of the opening, the inner surface being a sidewall of the aperture.

6. The mask assembly of claim 1, wherein the opening being a through hole that allows an evaporated deposition material to pass therethrough.

7. An apparatus for manufacturing a display apparatus, the apparatus comprising:
a chamber;
a deposition source arranged within the chamber to accommodate and emit a deposition material;
a mask separated from the deposition source and including an opening to form a pattern on a substrate, the opening being a through hole that allows deposition material from the deposition source to pass therethrough,
wherein a self-assembled monolayer (SAM) is coated on at least a portion of the mask, wherein the SAM comprises:
a head that contacts the mask;
a linker connected to the head; and
a terminal connected to the linker.

8. The apparatus of claim 7, wherein the bead is hydrophilic and the terminal is hydrophobic.

9. The apparatus of claim 7, wherein the SAM comprises at least one material selected from a group consisting of trichlorooctadecylsilane (OTS), fluoroctatrichlorosilane (FOTS), and dichlorodimethylsilane (DDMS).

10. The apparatus of claim wherein the SAM is coated on sidewalls of the through hole.

11. The apparatus of claim 7, wherein the SAM is coated on sidewalls of the opening and on a surface of the mask that faces the deposition source to prevent the opening from getting clogged by deposition material.

12. A method of manufacturing a display apparatus, the method comprising:
providing a chamber including a deposition source that accommodates a deposition material within;
inserting a substrate and a mask into the chamber, the mask being interposed between the deposition source and the substrate, the mask including an aperture;
aligning the substrate to the mask; and
depositing the deposition material onto the substrate via the opening in the mask by heating the deposition source and allowing the deposition material evaporated from the deposition source to reach the substrate by passing through the aperture in the mask,
wherein a self-assembled monolayer (SAM) is coated on at least a portion of the mask to prevent the aperture from getting clogged by the deposition material, wherein the SAM comprises:
a head that contacts the mask;
a linker connected to the head; and
a terminal connected to the linker.

13. The method of claim 12, wherein the head is hydrophilic and the terminal is hydrophobic.

14. The method of claim 12, wherein the SAM comprises at least one material selected from a group consisting of trichlorooctadecylsilane (OTS), fluoroctatrichlorosilane (FOTS), and dichlorodimethylsilane (DDMS).

15. The method of claim 12, wherein the SAM is coated about an inner surface of the aperture.

16. The method of claim 12, wherein the SAM is coated on a surface of the mask that faces the deposition source.

17. The method of claim 12, wherein the SAM is coated on the mask by using a vapor phase deposition technique.

* * * * *